US 9,685,591 B2

(12) United States Patent
Otto

(10) Patent No.: US 9,685,591 B2
(45) Date of Patent: Jun. 20, 2017

(54) METHOD FOR PRODUCING AN OPTOELECTRONIC SEMICONDUCTOR COMPONENT AND OPTOELECTRONIC SEMICONDUCTOR COMPONENT

(71) Applicant: OSRAM Opto Semiconductors GmbH, Regensburg (DE)

(72) Inventor: Isabel Otto, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/118,886

(22) PCT Filed: Jan. 27, 2015

(86) PCT No.: PCT/EP2015/051608
§ 371 (c)(1),
(2) Date: Aug. 14, 2016

(87) PCT Pub. No.: WO2015/121062
PCT Pub. Date: Aug. 20, 2015

(65) Prior Publication Data
US 2017/0062661 A1    Mar. 2, 2017

(30) Foreign Application Priority Data
Feb. 14, 2014  (DE) .................. 10 2014 101 896

(51) Int. Cl.
*H01L 33/44*        (2010.01)
*H01L 33/00*        (2010.01)
(Continued)

(52) U.S. Cl.
CPC .......... *H01L 33/44* (2013.01); *H01L 27/1446* (2013.01); *H01L 27/153* (2013.01);
(Continued)

(58) Field of Classification Search
None
See application file for complete search history.

(56) References Cited

U.S. PATENT DOCUMENTS 8,008,683 B2    8/2011  Choi et al.
8,866,175 B2    10/2014 Engl et al.
(Continued)

FOREIGN PATENT DOCUMENTS

DE    102009030243 A1    5/2010
DE    102010045784 A1    3/2012
(Continued)

*Primary Examiner* — Lex Malsawma
(74) *Attorney, Agent, or Firm* — Slater Matsil, LLP

(57) ABSTRACT

A method for producing an optoelectronic semiconductor component having a plurality of image points and an optoelectronic component are disclosed. In an embodiment the method includes providing a semiconductor layer sequence including an n-conducting semiconductor layer, an active zone, and a p-conducting semiconductor layer; applying a first layer sequence, wherein the first layer sequence is divided into a plurality of regions which are arranged laterally spaced with respect to each other on a top surface of the p-conducting semiconductor layer; c) applying a second insulating layer; partially removing the p-conducting semiconductor layer and the active zone, in such a way that the n-conducting semiconductor layer is exposed at points and the p-conducting semiconductor layer is divided into individual regions which are laterally spaced with respect to each other, wherein each of the regions comprises a part of the p-conducting semiconductor layer and a part of the active zone.

20 Claims, 5 Drawing Sheets

(51) Int. Cl.
*H01L 33/32* (2010.01)
*H01L 33/40* (2010.01)
*H01L 33/38* (2010.01)
*H01L 27/15* (2006.01)
*H01L 31/18* (2006.01)
*H01L 31/0304* (2006.01)
*H01L 31/0232* (2014.01)
*H01L 31/0224* (2006.01)
*H01L 31/0216* (2014.01)
*H01L 27/144* (2006.01)

(52) U.S. Cl.
CPC .. *H01L 31/02161* (2013.01); *H01L 31/02327* (2013.01); *H01L 31/022408* (2013.01); *H01L 31/03044* (2013.01); *H01L 31/1852* (2013.01); *H01L 31/1856* (2013.01); *H01L 33/007* (2013.01); *H01L 33/32* (2013.01); *H01L 33/38* (2013.01); *H01L 33/405* (2013.01); *H01L 2933/0016* (2013.01); *H01L 2933/0025* (2013.01)

(56) References Cited

U.S. PATENT DOCUMENTS

| | | | |
|---|---|---|---|
| 2007/0262323 A1 | 11/2007 | Sonobe et al. | |
| 2010/0096652 A1* | 4/2010 | Choi | H01L 33/08 257/98 |
| 2012/0007118 A1* | 1/2012 | Choi | H01L 33/382 257/98 |
| 2012/0050694 A1 | 3/2012 | Huang et al. | |
| 2012/0235168 A1 | 9/2012 | Katsuno et al. | |
| 2014/0014894 A1 | 1/2014 | Mohammed et al. | |
| 2015/0014716 A1 | 1/2015 | von Malm | |

FOREIGN PATENT DOCUMENTS

| | | |
|---|---|---|
| DE | 102011056888 A1 | 6/2013 |
| WO | 2013092304 A1 | 6/2013 |

* cited by examiner

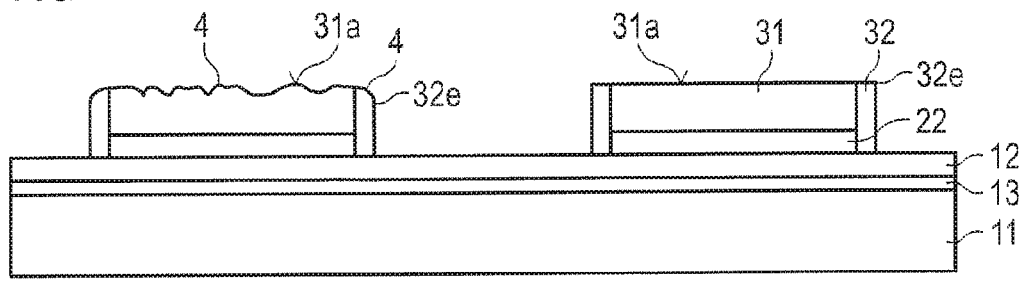
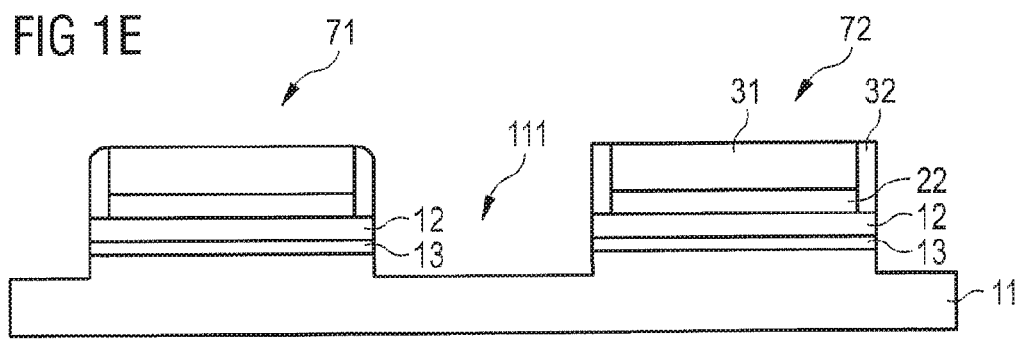
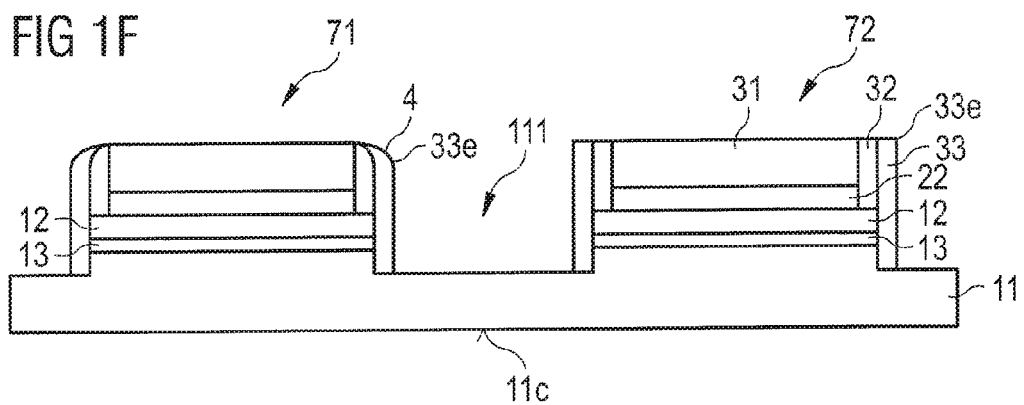

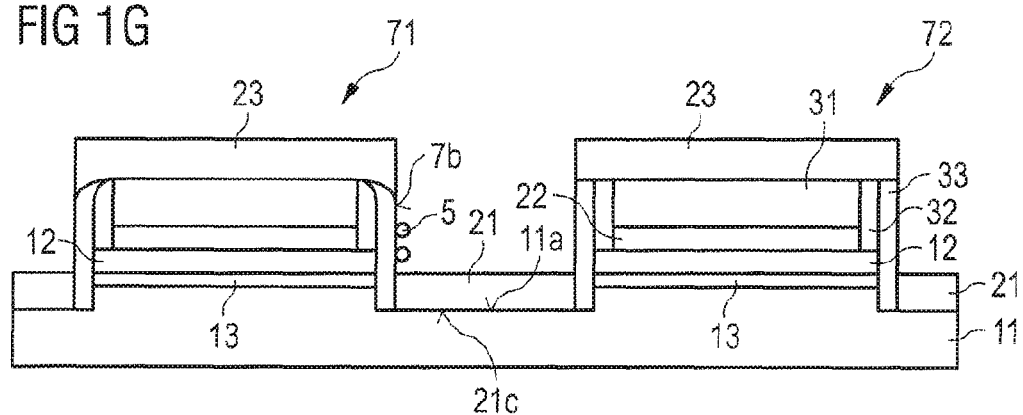
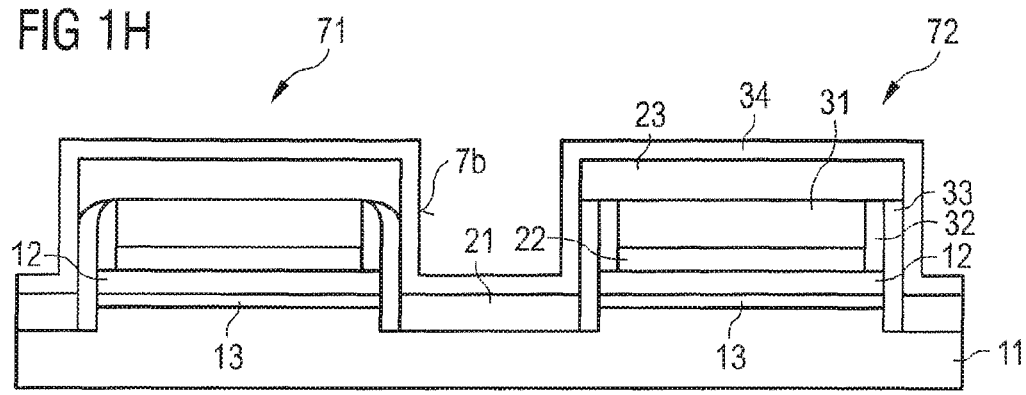
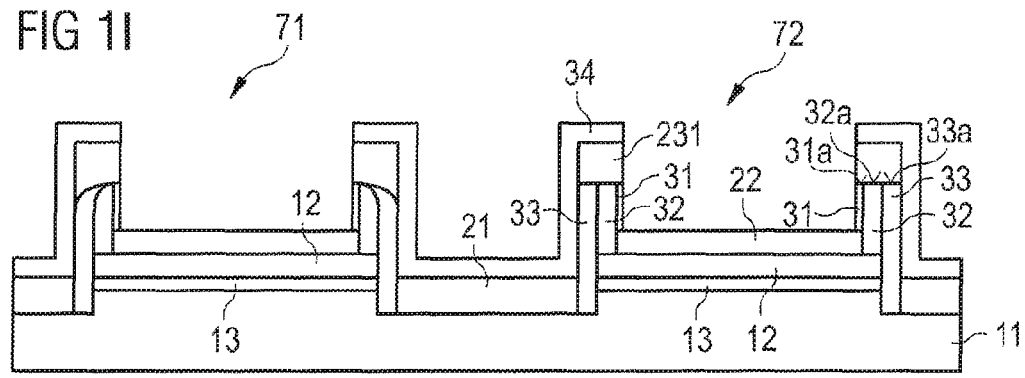

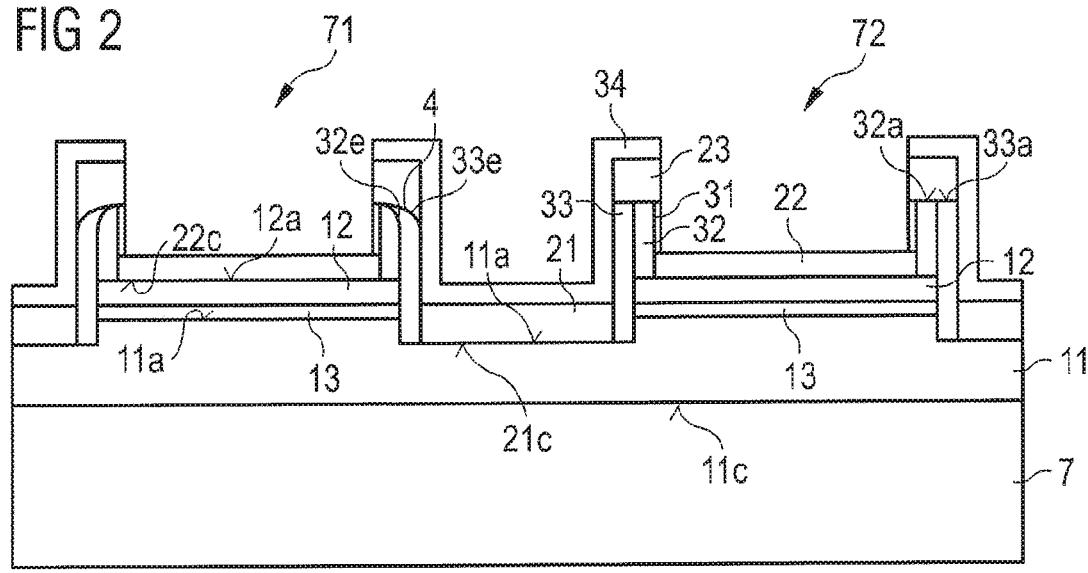
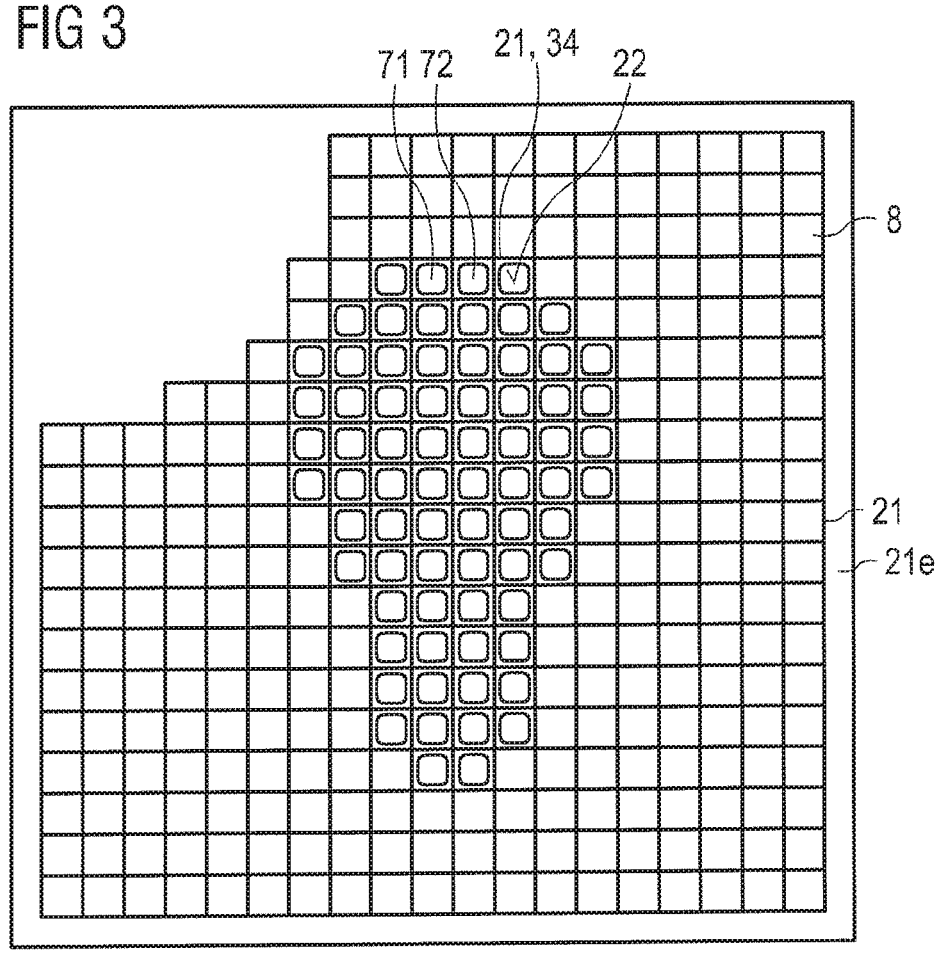

METHOD FOR PRODUCING AN OPTOELECTRONIC SEMICONDUCTOR COMPONENT AND OPTOELECTRONIC SEMICONDUCTOR COMPONENT

This patent application is a national phase filing under section 371 of PCT/EP2015/051608, filed Jan. 27, 2015, which claims the priority of German patent application 10 2014 101 896.6, filed Feb. 14, 2014, each of which is incorporated herein by reference in its entirety.

BACKGROUND

International Publication WO 2013/092304 A1 describes a display apparatus and a method for producing a display apparatus.

SUMMARY OF THE INVENTION

Embodiments of the invention provide a method for producing an optoelectronic semiconductor component having a simplified contacting. Furthermore, an optoelectronic semiconductor component is to be provided which comprises a multiplicity of image points, wherein the image points can be formed as small as possible.

A method for producing an optoelectronic semiconductor component is provided. The optoelectronic semiconductor component can be, for example, a radiation-emitting semiconductor component, e.g., a light-emitting diode chip. For example, the optoelectronic semiconductor component can be provided at least as part of a display apparatus and/or at least as part of a light source. Furthermore, the optoelectronic semiconductor component can be a radiation-detecting semiconductor component, such as, for example, a photodiode chip. In particular, electromagnetic radiation can be detected by the optoelectronic semiconductor component in a spatially resolved manner.

According to at least one embodiment of the method, a semiconductor layer sequence is initially provided. The semiconductor layer sequence has a main extension plane in which it extends in lateral directions. Perpendicular to the main extension plane, in the vertical direction, the semiconductor layer sequence has a thickness. The thickness of the semiconductor layer sequence is small compared with the maximum extension of the semiconductor layer sequence in a lateral direction. The semiconductor layer sequence can be produced, for example, by epitaxial growth.

According to at least one embodiment of the method, the semiconductor layer sequence comprises an n-conductive semiconductor layer having a base surface. The base surface of the n-conductive semiconductor layer is formed by a main plane of the semiconductor layer sequence. In particular, the base surface of the n-conductive semiconductor layer is the main extension plane. The n-conductive semiconductor layer can be, for example, a semiconductor layer which is epitaxially grown on a growth substrate. The n-conductive semiconductor layer includes, or is based on, for example, GaN and/or is preferably n-doped.

According to at least one embodiment of the method, the semiconductor layer sequence has an active zone arranged on a cover surface of the n-conductive semiconductor layer facing away from the base surface. The active zone is provided for generating radiation. For example, the active zone emits visible light. For example, the active zone includes, or is based on, GaN. The active zone can further contain other materials such as, for example, indium, aluminium and/or phosphorus, which influences the wavelength of the light emitted and/or detected by the semiconductor layer sequence.

According to at least one embodiment of the method, the semiconductor layer sequence includes a p-conductive semiconductor layer arranged on a side of the active zone facing away from the n-conductive semiconductor layer and preferably epitaxially grown on the active zone. The p-conductive semiconductor layer includes, or is based on, for example, GaN and/or is preferably p-doped.

According to at least one embodiment of the method, a first layer sequence is applied onto a cover surface of the p-conductive semiconductor layer facing away from the n-conductive semiconductor layer. The first layer sequence includes a p-contacting layer and a first insulation layer. The first layer sequence is divided into a multiplicity of regions which are arranged laterally spaced apart from each other on a cover surface of the p-conductive semiconductor layer facing away from the n-conductive semiconductor layer.

The p-contacting layer is preferably in direct contact with the p-conductive semiconductor layer. In this case, the p-contacting layer can be provided as a contact layer for the p-conductive semiconductor layer. The p-contacting layer contains, for example, Ag and/or Rh. For example, the use of Rh has the advantage that Rh can be more structurally true during etching than Ag, for example. Preferably, the p-contacting layer is formed to be reflective and has a high conductivity. Formed to be "reflective" can mean here and hereinafter that the p-contacting layer has a reflectivity for the radiation emitted or absorbed in the active zone of at least 90%, preferably at least 95%. In the case of a p-contacting layer which is formed to be reflective, the electromagnetic radiation emitted by the active zone is preferably radiated or reflected in the direction of the n-conductive semiconductor layer.

The first insulation layer is applied onto the side of the p-contacting layer facing away from the p-conductive semiconductor layer and is preferably in direct contact with the p-contacting layer. However, it is also possible to arrange a further contact layer, e.g., containing ZnO and/or Ti, directly on the p-contacting layer and for the first insulation layer to be in direct contact with this layer. Such a contact layer can protect the p-contacting layer from being in direct contact with other metals, for example, during subsequent method steps. The first insulation layer includes, e.g., $SiO_2$, SiN or another electrically insulating component.

According to at least one embodiment of the method, a second insulation layer is applied which extends transversely to the main extension plane and covers all the side flanks of the regions of the first layer sequence at least in places. "Side flanks of the first layer sequence" are intended to mean here and hereinafter the outer surfaces of the first layer sequence extending transversely to the main extension plane.

The second insulation layer can, at least in places, directly adjoin the first insulation layer, the p-contacting layer and the p-conductive semiconductor layer. The second insulation layer is formed to be electrically insulating. The second insulation layer can contain, e.g., $SiO_2$, SiN, $Al_2O_3$ or another electrically insulating material. The first and the second insulation layers completely cover the p-contacting layer. In other words, at those places at which the p-contacting layer is not covered by the first insulation layer or is not in direct contact with the first insulation layer, the p-contacting layer is at least covered by the second insulation layer or the p-contacting layer is in direct contact with the second insulation layer, and vice versa. This means that the p-contacting layer, after applying the second insulation layer, would no longer be freely accessible from the outside if no further method steps were to follow. The second insulation layer can then be used to encapsulate the p-contacting layer and/or can protect the p-contacting layer from chemicals used in subsequent method steps.

According to at least one embodiment of the method, the p-conductive semiconductor layer and the active zone are partially removed. This removal take place such that the n-conductive semiconductor layer is then exposed in places and the p-conductive semiconductor layer and the active zone are divided into individual regions which are laterally spaced apart from one another. Each of these individual regions then includes part of the p-conductive semiconductor layer and part of the active zone. The regions then form image points which are electrically separated from one another.

According to at least one embodiment of the method, an n-contacting layer and a metallization layer are applied. The n-contacting layer and the metallization layer each extend along, in particular exclusively along, the main extension plane of the semiconductor layer sequence. In other words, the n-contacting layer and the metallization layer do not extend along the side flanks of the regions of the first layer sequence or of the second insulation layer and/or not transversely to the semiconductor layer sequence.

Preferably, the n-contacting layer and the metallization layer are electrically insulated from one another. In this respect, the n-contacting layer and the metallization layer are spatially separated from one another, that is to say it is possible that the n-contacting layer and the metallization layer are not in direct contact. For example, an insulating material, such as e.g., air, can be arranged between the n-contacting layer and the metallization layer. For example, the n-contacting layer and/or the metallization layer are applied by means of a targeted deposition of the material of the n-contacting layer and/or the metallization layer. In this case it is possible that the side flanks of the first layer sequence or of the second insulation layer remain free of the material of the n-contacting layer and/or of the metallization layer. It is also possible that parts of the side flanks are coated with traces of the material of the n-contacting layer and/or the metallization layer. These traces of the material on the side flanks of the regions of the first layer sequence have substantially less material than the parts of the n-contacting layer and/or the metallization layer which are attached to the outer surfaces extending in parallel with the main extension plane. In particular, the traces of the material preferably do not form a continuous surface and a majority of the side flanks is free of traces of the material. For example, 80%, preferably 90%, of the side flanks can be free of the traces of the material. Preferably, photo technology is not used when applying the n-contacting layer and the metallization layer.

The n-contacting layer and the metallization layer are preferably formed from the same material and are preferably applied in the same method step. Preferably, the n-contacting layer and the metallization layer are formed to be reflective. For example, the n-contacting layer and the metallization layer contain silver, rhodium and/or another electrically conductive material.

According to at least one embodiment of the method, the metallization layer and the first insulation layer are partially removed. After the partial removal, the p-contacting layer is freely accessible or exposed. The removal can take place, for example, by means of an etching method. Preferably, a first mask is used for the etching method and is preferably applied onto the first insulation layer by means of photolithography and can be removed after etching.

However, here and hereinafter it is also possible to use a lift-off method instead of and/or in addition to an etching method. For example, in this respect initially a mask layer can be applied onto the p-conductive semiconductor layer and is removed at least in places. The p-contacting layer and the first insulation layer can then be grown in those regions on the p-conductive semiconductor layer in which the mask layer has not been removed. Then, the mask layer can be completely removed.

According to at least one embodiment of the method for producing an optoelectronic semiconductor component, the method comprises the following steps:

a) providing a semiconductor layer sequence having a main extension plane, having
    an n-conductive semiconductor layer having a base surface,
    an active zone on a cover surface of the n-conductive semiconductor layer facing away from the base surface, and
    a p-conductive semiconductor layer which is arranged on a side of the active zone facing away from the n-conductive semiconductive layer, b) applying a first layer sequence, comprising a p-contacting layer and a first insulation layer, wherein the first layer sequence is divided into a multiplicity of regions which are arranged laterally spaced apart from one another on a cover surface of the p-conductive semiconductor layer facing away from the n-conductive semiconductor layer, c) applying a second insulation layer which extends transversely to the main extension plane and covers all the side flanks of the first layer sequence at least in places, d) partially removing the p-conductive semiconductor layer and the active zone such that the n-conductive semiconductor layer is exposed in places and the p-conductive semiconductor layer and the active zone are divided into individual regions which are laterally spaced apart from one another, wherein each of the regions includes part of the p-conductive semiconductor layer and part of the active zone, e) applying an n-contacting layer and a metallization layer such that the n-contacting layer and the metallization layer each extend along the main extension plane of the semiconductor layer sequence, f) partially removing the metallization layer and the first insulation layer so that the p-contacting layer is exposed.

The described method steps are preferably performed in the stated sequence.

According to at least one embodiment of the method, the first insulation layer and the second insulation layer are used as a mask for the partial removal of the p-conductive semiconductor layer and the active zone. Therefore, only those places of the p-conductive semiconductor material which are not covered by the first and/or second insulation layer are removed. In other words, the partial removal of the p-conductive semiconductor layer can be a self-adjusting removal. Therefore, the application of a mask can be omitted.

According to at least one embodiment of the method, the p-conductive semiconductor layer and the active zone are removed by means of an etching method. In this respect, a wet-chemical etching method with, e.g., $H_3PO_4$ or a dry-chemical etching method with, e.g., chlorine plasma can be used. In general, the dry-chemical etching method can be, for example, a reactive ion etching or a reactive ion beam etching.

The method described herein is based in particular on the concept that by using self-adjusting etching, that is to say by using the first and second insulation layer used as a mask, the possibility of producing image points having a lateral dimension in the range of a few micrometers is achieved. This is permitted in particular by virtue of the fact that a smaller adjustment outlay compared with photo technology is required and in addition the provision of a mask is omitted.

According to at least one embodiment of the method, in step d), that is to say in the step in which the p-conductive semiconductor layer and the active zone are partially removed, the n-conductive semiconductor layer is additionally removed in places. Then, the n-conductive semiconductor layer comprises thinned regions in which the distance between the cover surface and the base surface of the n-conductive semiconductor layer is less than that in other, unthinned regions of the n-conductive semiconductor layer. In other words, the n-conductive semiconductor layer then no longer has a uniform thickness but rather comprises thinner and thicker regions. The thinner regions can then be trenches in the n-conductive semiconductor layer. Preferably, a highly conductive layer, which may be highly doped, contained in the n-conductive semiconductor layer is used as an etch stop layer. The cover surface of the thinned regions can then be formed by the highly conductive layer after the partial removal of the n-conductive semiconductor layer.

According to at least one embodiment of the method, the first layer sequence is produced using the following method steps: initially, the p-contacting layer is applied over the whole surface onto a side of the p-conductive semiconductor layer facing away from the n-conductive semiconductor layer. After applying the p-contacting layer, the first insulation layer is applied over the whole surface onto the side of the p-contacting layer facing away from the n-conductive semiconductor layer. "Applying over the whole surface" refers here and hereinafter to an application such that, on the side on which the layer to be applied is applied, the surface(s) is/are completely covered by this layer to be applied. After this method step, the first layer sequence can thus include a simply continuously formed p-contacting layer and a simply continuously formed first insulation layer.

The first insulation layer is then partially removed. For this purpose, a second mask can be used which, e.g., has been applied onto the first insulation layer by means of photolithography. The second mask can have larger dimensions in particular in the lateral direction than the first mask. After the partial removal of the first insulation layer, the p-contacting layer is partially removed, wherein the first insulation layer can be used as a mask for the partial removal of the p-contacting layer. It is also possible that for the partial removal of the p-contacting layer the same mask is used as for the partial removal of the first insulation layer. The first insulation layer can thus be a sacrificial layer which is dissolved or destroyed at the end of the production method and can protect the p-contacting layer from chemicals used in further method steps for example.

For example, the first insulation layer and the p-contacting layer are partially removed using an etching method. Preferably, the p-contacting layer and the first insulation layer can be selectively etched with respect to each other, that is to say that the etching method used for the partial removal of the first insulation layer does not remove the p-contacting layer, and vice versa. A wet-chemical and/or a dry-chemical etching method can be used as the etching method. For example, the first insulation layer can be etched in a wet-chemical manner using buffered oxide etching (BOE) and/or in a dry-chemical manner using fluoroplasma. The p-contacting layer can be etched in a wet-chemical and/or dry-chemical manner by means of, e.g., sputtering with Ar and/or with fluoroplasma.

Furthermore, a common photolithography mask can be used for the etching method, which mask can be applied onto the first insulation layer and can be removed after or before the etching of the p-contacting layer. The p-contacting layer and the first insulation layer can in this case be more structurally true, that is to say that the two-dimensional geometry of the photolithography mask can be transferred to the first layer sequence in an extremely precise manner. In other words, after etching, the surface area of the outer surface of the first insulation layer facing the mask substantially corresponds to the surface area of the surface of the mask delimiting the insulation layer. For example, the surface areas differ by at the most +/−10%.

After the partial removal, the first layer sequence comprises a multiplicity of regions which are arranged laterally spaced apart from each other on a cover surface of the p-conductive semiconductor layer facing away from the n-conductive semiconductor layer. The multiplicity of regions then form the image points. Preferably, the lateral dimensions of the p-contacting layer and of the first insulation layer of the respective regions are identical.

According to at least one embodiment of the method, between steps d) and e), that is to say between the partial removal of the p-conductive semiconductor layer and the active zone and the application of an n-contacting layer and the metallization layer, a third insulation layer is applied. This third insulation layer preferably extends transversely to the main extension plane and is in direct contact with the second insulation layer and the p-conductive semiconductor layer. It is further possible that the third insulation layer is in direct contact with the n-conductive semiconductor layer. The third insulation layer can be formed to be electrically insulating and contain, e.g., $SiO_2$, $SiN$, $Al_2O_3$ or another insulating material. The third insulation layer can outwardly electrically insulate the p-conductive semiconductor layer at its lateral surfaces which are produced by the partial removal of the p-conductive semiconductor layer in method step d).

Preferably, at least the third insulation layer is formed to be impermeable for radiation. It is further possible that the first and/or second insulation layer(s) is/are formed to be impermeable for radiation. "Impermeable for radiation" means that the electromagnetic radiation emitted or absorbed by the active zone is almost completely, i.e., at least to 75%, in particular to at least 85%, absorbed and/or reflected. In particular, "impermeable for radiation" can mean here and hereinafter that the first and/or second insulation layer(s) has/have an absorption coefficient and/or a reflectivity of at least 75%, in particular at least 85%, for the electromagnetic radiation emitted or absorbed by the active zone. This allows the image points to be optically separated from one another. In particular, crosstalk between the image points is thereby prevented.

According to at least one embodiment of the method, the second and/or third insulation layer(s) is/are produced using the following method steps: initially, the second and/or third insulation layer(s) is/are applied over the whole surface onto an exposed outer surface facing away from the base surface of the n-conductive semiconductor layer. The second and/or third insulation layer then cover(s) the layers which have been applied in previous method steps. Then, the second and/or third insulation layer(s) is/are partially removed so that the second and/or third insulation layer(s) extend(s) substantially transversely to the main extension plane of the semiconductor layer sequence. In other words, after the partial removal, the second and/or third insulation layer(s) cover(s) substantially only the side flanks of the layers grown in the previous method steps. For example, 90%, preferably 95%, of the outer surfaces, facing away from the n-conductive semiconductor layer, of the layers applied in previous method steps remains free of the material of the second and/or third insulation layer(s).

According to at least one embodiment of the method, the second and/or third insulation layer(s) is/are partially removed using a targeted dry etching method. For example, reactive ion etching and/or reactive ion beam etching can be used for this purpose. In particular, when producing the second insulation layer, it is possible that during the targeted etching, parts of the first insulation layer can also be removed, wherein the first insulation layer is then further formed to be continuous in the respective regions of the first layer sequence and completely covers the p-contacting layer. It is further possible that small parts of the second insulation layer remain on a cover surface of the first insulation layer facing away from the semiconductor layer sequence.

According to at least one embodiment of the method, between step e) and f), that is to say after applying the n-contacting layer and the metallization layer and prior to the partial removal of the metallization layer and the first insulation layer, the optoelectronic semiconductor component is immersed in an acid bath for a predeterminable time period. The acid bath can contain an acid which etches the material of the n-contacting layer and/or the metallization layer. All of the traces of said material located on the side flanks of the image points facing away from the p-contacting layer can be removed by the acid bath. However, it is also possible that small parts of said material remain on the side flanks.

For example, the immersion in the acid bath lasts for a time period of at least two to at the most ten seconds, preferably in a range of at least four to at the most six seconds. After the acid bath, the n-contacting layer and the metallization layer can be electrically insulated from one another. In other words, if traces of the material of the n-contacting layer and/or the metallization layer have previously resulted in an electrical connection between the n-contacting layer and the metallization layer, these are removed by the acid bath. This can reduce the probability of a short circuit.

According to at least one embodiment of the method, between steps e) and f), a fourth insulation layer is applied over the whole surface onto an exposed outer surface facing away from the base surface of the n-conductive layer. Preferably, the fourth insulation layer covers a cover surface of the n-contacting layer facing away from the semiconductor layer sequence, covers the side flanks of the image points and covers the cover surface of the metallization layer facing away from the n-conductive semiconductor layer. The fourth insulation layer can be in direct contact with the n-contacting layer. However, it is also possible to arrange a further contact layer, e.g., containing ZnO and/or Ti, directly on the p-contacting layer and for the fourth insulation layer to be in direct contact with this layer.

The first, second, third and/or fourth insulation layer(s) can be applied using a precursor. The precursor can be, for example, tetraethyl orthosilicate (TEOS) and/or a silane.

According to at least one embodiment of the method, in and/or prior to step f), the fourth insulation layer is partially removed at those places at which it is arranged over the p-contacting layer. The removal can take place directly before the partial removal of the metallization layer and the first insulation layer, but it is also possible for the partial removal to take place in the same method step.

An optoelectronic semiconductor component is also provided. The optoelectronic semiconductor component can preferably be produced by means of the method described herein, that is to say all of the features disclosed for the method are also disclosed for the optoelectronic semiconductor component, and vice versa.

According to at least one embodiment of the optoelectronic semiconductor component, this includes a semiconductor layer sequence having a main extension plane which comprises an n-conductive semiconductor layer which is formed in one piece. In other words, the n-conductive semiconductor layer is simply continuously formed. Furthermore, the semiconductor layer sequence comprises an active zone and a p-conductive semiconductor layer which are jointly divided into a multiplicity of regions which are laterally spaced apart from one another. "Jointly" can be mean here and hereinafter that the p-conductive semiconductor layer and the active zone have the same or geometrically similar lateral dimensions within the scope of production tolerances and are completely in direct contact with one another at mutually facing surfaces. In this case, each region of the p-conductive semiconductor layer and of the active zone form together with the n-conductive semiconductor layer precisely one image point. The p-conductive semiconductor layer and the active zone are accordingly formed in multiple pieces. The image points are arranged laterally spaced apart from one another on the n-conductive semiconductor layer and are preferably electrically and/or optically separated from one another.

According to at least one embodiment of the optoelectronic semiconductor component, this includes an n-contacting layer which is formed to be electrically conductive and whose base surface directly adjoins the n-conductive semiconductor layer. The n-contacting layer is preferably provided for electrically contacting the n-conductive semiconductor layer. Furthermore, the optoelectronic semiconductor component includes a p-contacting layer which is formed to be electrically conductive and whose base surface directly adjoins the p-conductive semiconductor layer. The n-contacting layer and the p-contacting layer are electrically insulated from one another. The p-contacting layer is preferably provided for electrically contacting the p-conductive semiconductor layer.

According to at least one embodiment of the optoelectronic semiconductor component, this includes a third insulation layer which is formed to be electrically insulating and extends substantially transversely to the main extension direction of the semiconductor layer sequence. The third insulation layer is arranged between the p-conductive semiconductor layer and the n-contacting layer and directly adjoins all the lateral surfaces of the n-contacting layer and the p-conductive semiconductor layer. The third insulation layer is used primarily to encapsulate the p-conductive semiconductor layer from the n-conductive semiconductor layer. Preferably, the third insulation layer is formed to be impermeable for radiation.

According to at least one embodiment of the optoelectronic semiconductor component, the n-contacting layer is formed to be continuous and surrounds the image points in a frame-like manner. "In a frame-like manner" does not mean that the image points have to surrounded at four lateral surfaces arranged at right angles to one another. As seen in plan view, the image points can also be formed, for example, in a triangular, polygonal, oval or round shape and are accordingly surrounded by the n-contacting layer. In other words, the n-contacting layer is formed to be repeatedly continuous, wherein all of the n-contacting layers of the image points are electrically connected together. In a view of the optoelectronic semiconductor component from the base surface and/or cover surface, the n-contacting layer would then appear as a lattice or network, wherein the image points are surrounded by individual meshes of the lattice or network. By virtue of the fact that the n-contacting layer is formed to be continuous, a simple electrical contacting of the n-conductive semiconductor layer is permitted. For example, the n-contacting layer is outwardly extended at the edge of the optoelectronic semiconductor component, whereby simple contacting is permitted.

According to at least one embodiment of the optoelectronic semiconductor component, the cover surface of the n-conductive semiconductor layer is, in the region of the image points, at a greater distance to the base surface of the n-conductive semiconductor layer than in the region of the n-contacting layer. In other words, the n-conductive semiconductor layer comprises trenches in which the n-contacting layer is located. In other words, the n-conductive semiconductor layer comprises thinned regions, on whose cover surface the n-contacting layer is arranged in each case, and unthinned regions, on whose cover surfaces the image points are arranged in each case.

According to at least one embodiment of the optoelectronic semiconductor component, this includes a semiconductor layer sequence having a main extension plane, comprising an n-conductive semiconductor layer, which is formed in one piece, an active zone and a p-conductive semiconductor layer which are divided into a multiplicity of regions which are laterally spaced apart from one another, wherein each region forms together with the n-conductive semiconductor layer precisely one image point, and an n-contacting layer which is formed to be electrically conductive and one base surface of which adjoins the n-conductive semiconductor layer, a p-contacting layer which is formed to be electrically conductive and one base surface of which adjoins the p-conductive semiconductor layer, and a third insulation layer which is formed to be electrically insulating and extends transversely to the main extension direction of the semiconductor layer sequence, wherein the third insulation layer is arranged between the p-conductive semiconductor layer and the n-contacting layer and directly adjoins all the lateral surfaces of the n-contacting layer and the p-conductive semiconductor layer, the n-contacting layer is formed to be continuous and surrounds the image points in a frame-like manner and the cover surface of the n-conducting semiconductor layer is, in the region of the image points, at a greater distance to the base surface of the n-conductive semiconductor layer than in the region of the n-contacting layer.

According to at least one embodiment of the optoelectronic semiconductor component, the third insulation layer surrounds the image points on all the lateral surfaces. In other words, the third insulation layer is used to electrically and/or optically encapsulate the image points. For example, the third insulation layer electrically insulates the image points from the n-contacting layer.

According to at least one embodiment of the optoelectronic semiconductor component, this includes a second insulation layer which extends transversely to the main extension plane of the semiconductor layer sequence and is arranged between the third insulation layer and the p-contacting layer. The second insulation layer can electrically insulate the p-contacting layer at its sides, whereas the third insulation layer can electrically and/or optically insulate the p-conductive semiconductor layer at its sides.

According to at least one embodiment of the optoelectronic semiconductor component, this includes a metallization layer which is arranged in the perpendicular direction to the main extension plane spaced apart from the n-contacting layer and from the p-contacting layer on the cover surfaces of the second and/or third insulation layer(s) facing away from the n-conductive semiconductor layer. During operation of the optoelectronic semiconductor component, the metallization layer is not electrically connected. The metallization layer preferably consists of the same material as the n-contacting layer.

In a view from the side of the n-conductive semiconductor layer facing away from the base surface, a continuous metallization layer is then produced which is formed from the p-contacting layer, the n-contacting layer and the metallization layer. However, the p-contacting layer, the n-contacting layer and the metallization layer are electrically insulated from one another. This can be achieved by these three layers being at different distances to the n-conductive semiconductor layer. In other words, an electrically conductive layer is always arranged along the main plane of the semiconductor layer sequence, wherein it is possible that the electrically conductive layer does not lie in a plane.

According to at least one embodiment of the optoelectronic semiconductor component, this includes a fourth insulation layer which completely surrounds the image points at their side flanks facing away from the p-contacting layer and directly adjoins the n-contacting layer, the metallization layer and the third insulation layer. The fourth insulation layer is used, for example, to outwardly electrically insulate the optoelectronic semiconductor component and can protect the optoelectronic semiconductor component from short circuits. The fourth insulation layer is based in particular on the concept of outwardly electrically insulating the n-contacting layer. It is accordingly possible that the n-contacting layer can be contacted only on the lateral surfaces which laterally terminate the optoelectronic semiconductor component.

According to at least one embodiment of the optoelectronic semiconductor component, a first insulation layer is arranged on a cover surface of the p-contacting layer facing away from the n-contacting semiconductor layer and covers the cover surface of the p-contacting layer facing away from the semiconductor layer sequence such that a majority of the p-contacting layer remains free of the first insulation layer. For example, a maximum of 20%, preferably a maximum of 10%, of the cover surface of the p-contacting layer can be covered by the first insulation layer. This permits an electrical contacting of the p-contacting layer. For example, the finished semiconductor component can be applied onto a silicon substrate which contains individual transistors for actuation. The first insulation layer can be in direct contact with the p-contacting layer and the second insulation layer.

In this case, the first insulation layer can be applied onto the p-contacting layer in a frame-like manner. The first insulation layer can be formed to be symmetrical within the scope of production tolerances. For example, the frame-like formation of the first insulation layer was achieved using a photolithographic technique. "Within the scope of production tolerances" can then dictate the accuracy of the photolithographic technique and be in the range of 2 µm, for example.

According to at least one embodiment of the optoelectronic semiconductor component, the second and third insulation layers have traces of a material removal on their corners and/or edges facing away from the n-conductive semiconductor layer and the p-contacting layer. These traces of a material removal can be caused by the targeted removal of the second or third insulation layer during the production process. The edges of the respective layer are the places at which the lateral surfaces of the respective layer extending transversely to the main extension plane meet the cover surface of the layer extending in parallel with the main extension plane within the scope of production tolerances. The corners are the places at which two edges meet each other. For example, the corners and/or edges can be flattened and/or rounded by the material removal. It is in particular possible that the corners and/or edges of the third insulation layer have been removed such that the second insulation layer is partially exposed at its corners and/or edges. The method for producing the second and/or third insulation layer(s) can accordingly be seen on the finished optoelectronic semiconductor component.

According to at least one embodiment of the optoelectronic semiconductor component, the image points have identical geometric dimensions along the main extension plane, within the scope of production tolerances. In other words, the geometric dimensions of the regions of the active zone of the image points along the main extension plane differ from each other by a maximum of 10%, preferably a maximum of 5%. This sometimes allows the image points to be used as a display apparatus.

According to at least one embodiment of the optoelectronic semiconductor component, the lateral geometric dimension of the n-contacting layer along an imaginary connection line between the center points of two adjacent image points is at the most 5 μm. The expression "center point of an image point" can mean here and hereinafter the point on the cover surface of the p-conductive semiconductor layer which, in all of the lateral directions, is at the largest distance to the second insulation layer surrounding the image point and/or to the n-contacting layer. The n-contacting layer is accordingly formed to be extremely narrow, whereby a large radiation passage surface is ensured. This narrow formation of the n-contacting layer is possible in particular owing to the self-adjusting mask of the method. The size of the radiation passage surface of an image point is, in this case, provided substantially by the lateral dimension of the active zone of the image point.

According to at least one embodiment of the semiconductor component, the lateral distance between two adjacent image points along an imaginary connection line between the center points of these adjacent image points is at the most 12 μm. Preferably, the lateral distance between the image points can be at the most 10 μm. In other words, the image points can be formed to be extremely small, wherein the entire radiation passage surface of the optoelectronic semiconductor component, that is to say the surface which is formed from the radiation passage surfaces of all the image points, can be only insubstantially smaller than the overall surface of the optoelectronic semiconductor component along the main extension plane. In other words, the n-contacting layer is formed to be extremely small along the main extension plane compared with the size of the image points along the main extension plane.

BRIEF DESCRIPTION OF THE DRAWINGS

The method described herein and the optoelectronic semiconductor component described herein will be explained in more detail hereinafter with the aid of exemplified embodiments and the associated figures.

FIG. 2 shows a schematic illustration of an exemplified embodiment of an optoelectronic semiconductor component described herein.

FIG. 3 shows a light microscope picture of an exemplified embodiment of an optoelectronic semiconductor component described herein.

Figure 1A:
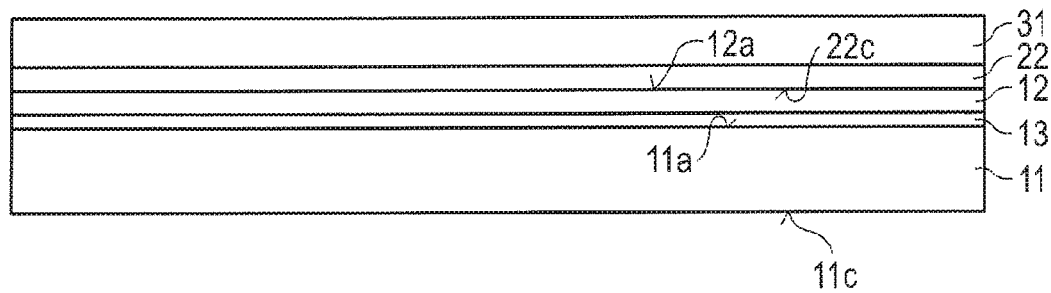
FIG. 1 shows an exemplified embodiment of the method described herein with the aid of schematic sectional illustrations.

Identical, similar elements or elements which act in an identical manner are provided with the same reference numerals in the figures. The figures and the size ratios of the elements with respect to each other, as illustrated in the figures, are not to be considered as being to scale. Rather, individual elements can be illustrated excessively large for improved clarity and/or for improved understanding.

DETAILED DESCRIPTION OF ILLUSTRATIVE EMBODIMENTS

A first method step of a method described herein for producing an optoelectronic semiconductor component is explained in more detail with the aid of the schematic sectional illustration in FIG. 1A. Initially, the semiconductor layer sequence 11, 12, 13 having the n-conductive semiconductor layer 11 having the base surface 11c is provided.

The active zone 13 and the p-conductive semiconductor layer 12 are applied onto the cover surface 11a. Furthermore, the first layer sequence 22, 31 which includes the p-contacting layer 22 and the first insulation layer 31 is applied over the whole surface onto the semiconductor layer sequence 11, 12, 13.

Figure 1B:
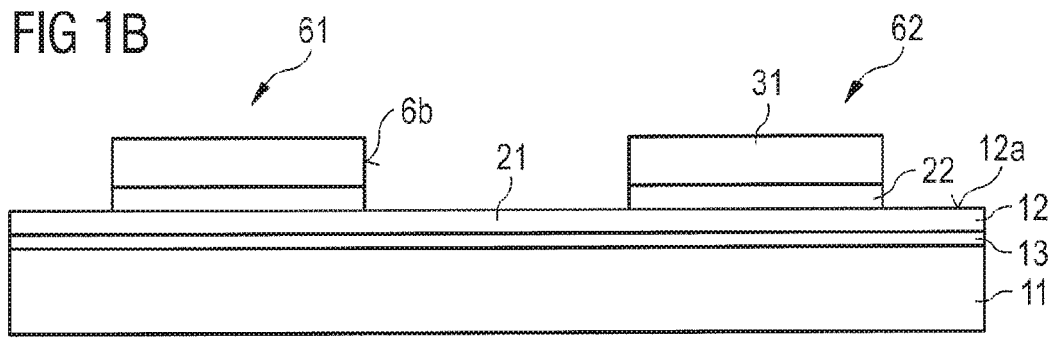

A further method step of a method described herein for producing an optoelectronic semiconductor component is explained in more detail with the aid of the schematic sectional illustration in FIG. 1B. The first layer sequence 22, 31 is partially removed. The first layer sequence 22, 31 is hereby divided into a multiplicity of regions 61, 62 which are arranged laterally spaced apart from each other on a cover surface 12a of the p-conductive semiconductor layer 12 facing away from the n-conductive semiconductor layer 11. The regions 61, 62 are spatially separated from one another. In other words, the regions 61, 62 are not connected together.

Figure 1C:
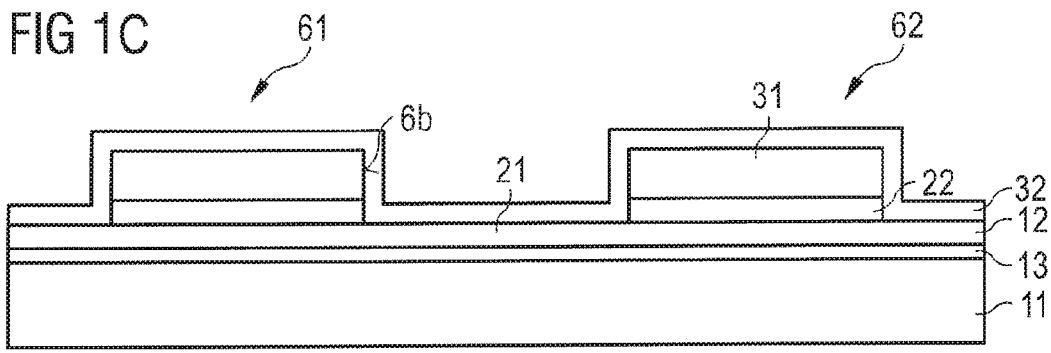

A further method step of a method, described herein, for producing an optoelectronic semiconductor component is explained in more detail according to the schematic sectional illustration in FIG. 1C. Now, the second insulation layer 32 is applied over the whole surface onto an exposed outer surface facing away from the base surface 11c of the n-conductive semiconductor layer 11, said second insulation layer being in direct contact with the p-conductive semiconductor layer 12, the first insulation layer 31 and the p-contacting layer 22. In particular, the second insulation layer 32 covers the side flanks 6b of the regions 61, 62 of the first layer sequence 22, 31.

FIG. 1D describes a further method step of a method described herein. The second insulation layer 32 is partially removed so that then the second insulation layer 32 extends substantially transversely to the main extension plane of the semiconductor layer sequence 11, 12, 13. The second insulation layer then still completely covers only the side flanks 6b of the regions 61, 62 of the first layer sequence 22, 31. In this case, it is possible that the second insulation layer 32 comprises traces of a material removal 4. These traces of a material removal 4 can also be present on the cover surface 31a of the first insulation layer 31 facing away from the n-conductive semiconductor layer 11. The traces of the material removal 4 are caused by the targeted etching method which was used to partially remove the second insulation layer 32. For example, the traces of the material removal can result in a flattening or rounding of the corners and/or edges 32e of the second insulation layer 32.

In a further method step, FIG. 1E, the p-conductive semiconductor layer 12, the active zone 13 and the n-conductive semiconductor layer 11 are partially removed. The partial removal takes place, e.g., using an etching method, wherein the first insulation layer 31 and the second insulation layer 32 are used as a mask for the etching method.

As shown in FIG. 1E, the p-conductive semiconductor layer 12 and the active zone 13, after the partial removal, are divided into a multiplicity of regions which form image points 71, 72.

The n-conductive semiconductor layer 11 is furthermore formed in one piece after the partial removal. However, the n-conductive semiconductor layer 11 now comprises trenches in at which the n-conductive semiconductor layer 11 is thinned out. The cover surface 11a of the n-conductive semiconductor layer 11 is, in the thinned out regions 111, at a smaller distance to the base surface 11c of the n-conductive semiconductor layer 11 than in the regions of the image points 71, 72. In other words, the cover surface 11a of the n-conductive semiconductor layer 11 is at, in the region of the image points 71, 72, a larger distance to the base surface 11c of the n-conductive semiconductor layer 11 than in the regions of the trenches 111. Image points 71, 72 are not provided in the regions of the trenches 111, and vice versa.

A further method step of a method described herein for producing an optoelectronic semiconductor component is explained in more detail with the aid of the schematic sectional illustration in FIG. 1F. In this method step, a third insulation layer 33 is applied. In this respect, as in the method step in FIG. 1C, initially the third insulation layer 33 is applied over the whole surface onto an exposed outer surface facing away from the base surface of the n-conductive semiconductor layer 11. Then, the third insulation layer 33 is partially removed, wherein in this case traces of a material removal 4 can also remain on the corners and/or edges 33e of the third insulation layer 33. The third insulation layer 33 then extends transversely to the main extension plane of the semiconductor layer sequence 11, 12, 13. The third insulation layer 33 can be in direct contact with the n-conductive semiconductor layer 11, the p-conductive semiconductor layer 12, the n-contacting layer 22 and the second insulation layer 32.

A further method step for producing an optoelectronic semiconductor component described herein is explained in more detail according to the schematic sectional illustration in FIG. 1G. In this method step, an n-contacting layer 21 and a metallization layer 23 are applied, wherein the n-contacting layer 21 and the metallization layer 23 extend along the main extension plane of the semiconductor layer sequence 11, 12, 13. Traces of the material 5 of the n-contacting layer 21 and/or the metallization layer 23 are located on the side flanks 7b of the image points 71, 72 facing away from the p-contacting layer 22. These traces of said material 5 can be removed in a subsequent method step, e.g., using an acid bath. The n-contacting layer 21 is in direct contact with the n-conductive semiconductor layer 11. The metallization layer 23 is electrically insulated from the n-contacting layer 21 and the p-contacting layer 22. During operation of the optoelectronic semiconductor component, the metallization layer 23 is not electrically connected.

A further method step of a method, described herein, for producing an optoelectronic semiconductor component is explained in more detail with the aid of the schematic sectional illustration in FIG. 1H. In this method step, a fourth insulation layer 34 is applied over the whole surface onto the outer surfaces facing away from the base surface 11c of the n-conductive semiconductor layer 11. The fourth insulation layer 34 then completely covers the n-contacting layer 21, the third insulation layer 33 and the metallization layer 23. The fourth insulation layer 34 is in particular provided in order outwardly electrically insulate the n-contacting layer 21.

A further method step of a method for producing an optoelectronic semiconductor component is explained in more detail with the aid of the schematic sectional illustration in FIG. 1I. In this method step, the fourth insulation layer 34, the first insulation layer 31 and the metallization layer 23 are partially removed so that the p-contacting layer 22 is then freely accessible from the outside. Parts of the first insulation layer 31 remain on the image points 71, 72 which surround the p-contacting layer 22 in a frame-like manner. The first insulation layer 31 now covers at the most 10%, preferably at the most 5%, of the p-contacting layer 22. Likewise, parts of the metallization layer 23 remain on the image points 71, 72 which are arranged spaced apart from the semiconductor layer sequence 11, 12, 13 on the cover surfaces of the first 31a, the second 32a and/or the third 33a insulation layer.

The image points 71, 72 are then separated from one other by the trenches 111. It is in particular possible that the n-contacting layer 21 is formed to be reflective and/or the third insulation layer 33 is formed to be impermeable for radiation so that the image points 71, 72 are optically separated from one another. Furthermore, the trenches in permit an optimum electrical and/or optical separation of the image points 71, 72.

An exemplified embodiment of an optoelectronic semiconductor component described herein is explained in more detail according to the schematic sectional illustration in FIG. 2. The optoelectronic semiconductor component includes a semiconductor layer sequence 11, 12, 13 having an n-conductive semiconductor layer 11, an active zone 13 and a p-conductive semiconductor layer 12. Furthermore, the optoelectronic semiconductor component includes an n-contacting layer 21 which is in direct contact with the n-conductive semiconductor layer 11 and is formed to be electrically conductive, and a p-contacting layer 22 which directly adjoins the p-conductive semiconductor layer 12 and is likewise formed to be electrically conductive. The optoelectronic semiconductor component additionally includes a first insulation layer 31, a second insulation layer 32, a third insulation layer 33 and a fourth insulation layer 34. The third insulation layer 33 is arranged between the p-conductive semiconductor layer 12 and the n-contacting layer 21 and extends transversely to the main extension plane of the optoelectronic semiconductor component. The third insulation layer 33 directly adjoins all the lateral surfaces of the n-contacting layer 21 and the p-conductive semiconductor layer 12. The third insulation layer 33 can electrically and/or optically insulate the p-conductive semiconductor layer 12 from the n-contacting layer 21.

The width of the n-contacting layer, that is to say the dimension thereof along an imaginary connection line between the center points of two adjacent image points, can in this case be in a range of at least 2 μM to at the most 10

μm. Furthermore, the lateral distance between two adjacent image points along an imaginary connection line between the center points of these adjacent image points, can be in a range of at least 5 μm to at the most 20 μm.

The second 32 and the third 33 insulation layers each extend transversely to the main extension plane of the semiconductor layer sequence 11, 12, 13. In other words, the second and the third insulation layers 32, 33 are each arranged at the side flanks 7b of the image points 71, 72.

Furthermore, the optoelectronic semiconductor component includes a metallization layer which is arranged on the second 32 and third 33 insulation layers. The metallization layer 23 is not electrically connected to the semiconductor layer sequence 11, 12, 13, the n-contacting layer 21 and/or the p-contacting layer 22.

The optoelectronic semiconductor component can additionally include a growth substrate 7. The growth substrate 7 can be formed, for example, with sapphire or another material which is suitable for growing semiconductor layer sequences 11, 12, 13. However, it is also possible, as shown, for example, in FIG. 1H, that the optoelectronic semiconductor component does not include a substrate 7. Preferably, the growth substrate 7 is formed of a material which is permeable for the electromagnetic radiation emitted by the active zone. Preferably, the optoelectronic semiconductor component then irradiates in the direction of the growth substrate 7.

Furthermore, the second insulation layer 32 and/or the third insulation layer 33 have traces of a material removal 4 at least in places. In the present case, the traces of the material removal 4 are flattened portions or rounded portions of the corners and/or edges 32e, 33e of the second insulation layer 32 and/or the third insulation layer 33.

A further exemplified embodiment of an optoelectronic semiconductor component described herein is explained in more detail with the aid of the light microscope picture in FIG. 3. The view is from the side of the optoelectronic semiconductor component facing away from the base surface 11c. The optoelectronic semiconductor component includes a multiplicity of image points 71, 72 which are arranged laterally spaced apart from one another. The image points are surrounded by the n-contacting layer 21 in a frame-like manner. The n-contacting layer 21 is formed to be repeatedly continuous and can take the shape of a lattice which surrounds the image points 71, 72. The n-contacting layer 21 can be electrically contacted at the lateral outer surfaces 21e of the optoelectronic semiconductor component.

Furthermore, closed image points 8 are shown. In these closed image points 8, the first insulation layer 31, the metallization layer 23 and the fourth insulation layer 34 have not been partially removed. The closed image points 8 have thus not yet been opened and the p-contacting layer 22 of the closed image points 8 is not freely accessible.

Figure 4:
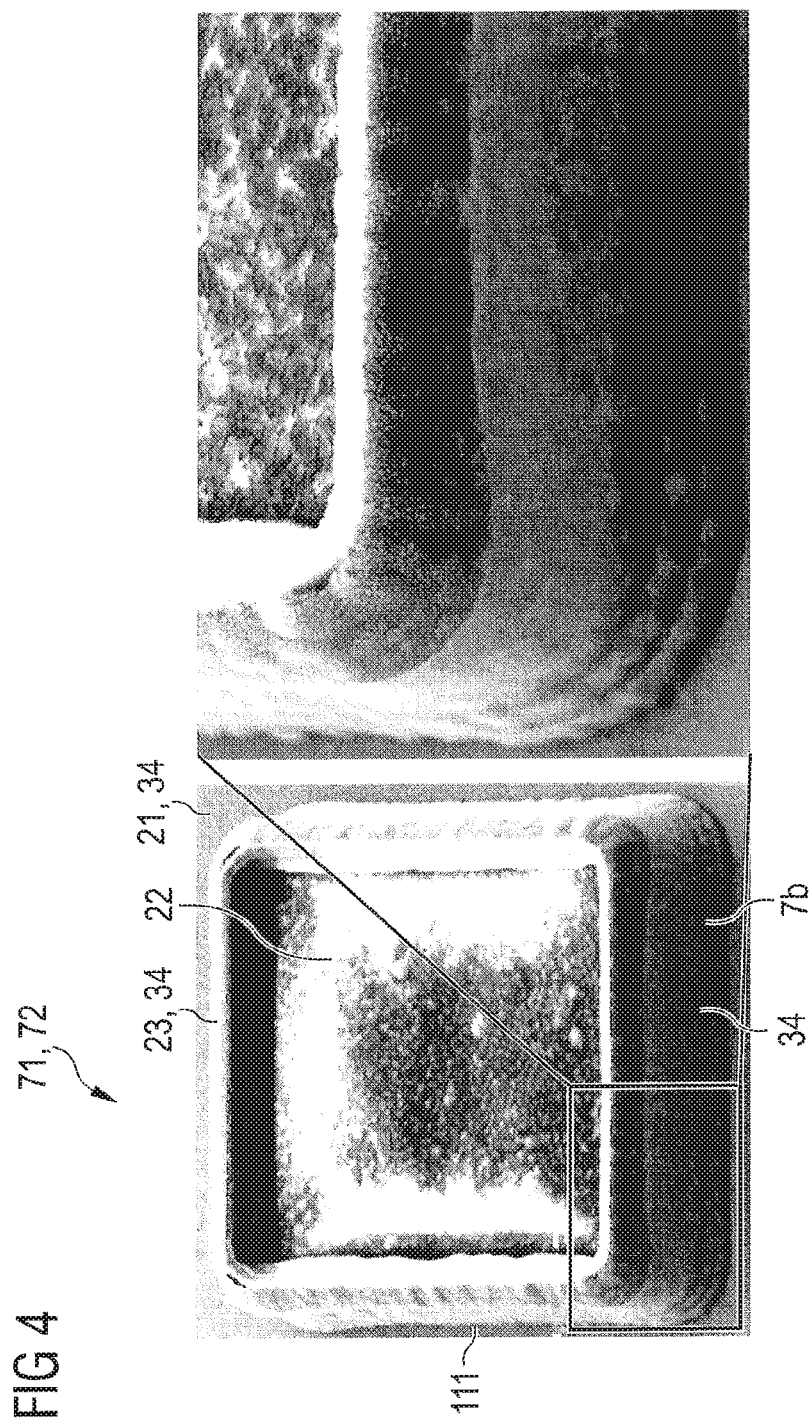
FIG. 4 shows a picture taken with a scanning electron microscope of an exemplified embodiment of an optoelectronic semiconductor component described herein.

A further exemplified embodiment of an optoelectronic semiconductor component described herein is explained in more detail according to the scanning electron microscope picture in FIG. 4. The optoelectronic semiconductor component comprises trenches iii. The second, third and fourth insulation layers 32, 33, 34 are arranged between the trenches and the p-contacting layer 22. The n-contacting layer 21, which surrounds an image point 71, 72 in a frame-like manner, is located in the trenches.

The frame-like and single-piece design of the n-contacting layer 21 permits a simply formed contacting of the n-conductive semiconductor layer 11. In particular, by virtue of the fact that the n-contacting layer 21 is not arranged on the base surface 11c but rather on the cover surface 11a of the n-conductive semiconductor layer 11, it is possible for the radiation passage surface of the optoelectronic semiconductor component as a whole not to be substantially reduced. The n-contacting layer 21 can be formed to be particularly narrow owing to the self-adjusting etching of the trench in because the inaccuracies of an adjustment by, e.g., photo technology do not occur. The first, second, third and fourth insulation layers 31, 32, 33, 34 are deposited for the electrical insulation of the n-contacting layer 21 from the p-contacting layer 22. In addition, by introducing the metalized trench in, the optical crosstalk between the image points 71, 72 is prevented, whereby the contrast ratio is improved and a uniform power distribution is achieved. This permits in particular a homogeneous light density distribution over the entire optoelectronic semiconductor component.

The invention is not limited to the exemplified embodiments by the description thereof; rather, the invention includes any new feature and any combination of features, including in particular any combination of features in the claims, even if this feature or this combination is not itself explicitly indicated in the claims or exemplified embodiments.

The invention claimed is:

1. A method for producing an optoelectronic semiconductor component having a multiplicity of image points, the method comprising:

providing a semiconductor layer sequence having a main extension plane, wherein the semiconductor layer sequence comprises an n-conductive semiconductor layer having a base surface, an active zone disposed on a cover surface of the n-conductive semiconductor layer facing away from the base surface, and a p-conductive semiconductor layer arranged on a side of the active zone facing away from the n-conductive semiconductor layer;

applying a first layer sequence comprising a p-contacting layer and a first insulation layer, wherein the first layer sequence is divided into a plurality of regions which are arranged laterally spaced apart from one another on a cover surface of the p-conductive semiconductor layer facing away from the n-conductive semiconductor layer;

applying a second insulation layer extending substantially transversely to the main extension plane and covering all the side faces of the first layer sequence at least in places;

partially removing the p-conductive semiconductor layer and the active zone such that the n-conductive semiconductor layer is exposed in places and the p-conductive semiconductor layer and the active zone are divided into individual regions which are laterally spaced apart from one another, wherein each of the regions includes a part of the p-conductive semiconductor layer and part of the active zone;

applying an n-contacting layer and a metallization layer such that the n-contacting layer and the metallization layer each extend along the main extension plane of the semiconductor layer sequence; and partially removing the metallization layer and the first insulation layer such that the p-contacting layer is exposed at least in places.

2. The method according to claim 1, wherein partially removing the p-conductive semiconductor layer and the active zone comprises using the first insulation layer and the second insulation layer as a mask.

3. The method according to claim 2, wherein partially removing the p-conductive semiconductor layer and the active zone comprises applying an etching method.

4. The method according to claim 1, wherein partially removing the p-conductive semiconductor layer and the active zone comprises partially removing the n-conductive semiconductor layer in places forming thinned regions of the n-conductive semiconductor layer, and wherein a distance between the cover surface and the base surface of the n-conductive semiconductor layer in the thinned regions is smaller than in other, unthinned regions of the n-conductive semiconductor layer.

5. The method according to claim 1, wherein applying the first layer sequence comprises:
applying the p-contacting layer over the whole surface onto the cover surface of the p-conductive semiconductor layer;
applying the first insulation layer over the whole surface onto a side of the p-contacting layer facing away from the n-conductive semiconductor layer;
partially removing the first insulation layer; and
partially removing the p-contacting layer, wherein the first insulation layer is used as a mask.

6. The method according to claim 1, further comprising applying a third insulation layer extending substantially transversely to the main extension plane after partially removing the p-conductive semiconductor layer and the active zone and before applying the n-contacting layer and the metallization layer, and wherein the third insulation layer is in direct contact with the second insulation layer and the p-conductive semiconductor layer.

7. The method according to claim 1, wherein applying the second insulation layer and/or a third insulation layer comprises:
applying the second insulation layer and/or the third insulation layer over the whole surface onto an exposed outer surface facing away from the base surface of the n-conductive semiconductor layer; and
partially removing the second insulation layer and/or the third insulation layer so that the second insulation layer and/or the third insulation layer extend substantially transversely to the main extension plane of the semiconductor layer sequence.

8. The method according to claim 7, wherein partially removing comprises a targeted dry etching method.

9. The method according to claim 1, further comprising immersing the optoelectronic semiconductor component in an acid bath for a predetermined time period after applying the n-contacting layer and the metallization layer, and before partially removing the metallization layer, wherein immersing removes traces of a material of the n-contacting layer and/or of the metallization layer located on the side faces of the image points.

10. The method according to claim 1, wherein a fourth insulation layer is applied over the whole surface onto an exposed outer surface facing away from the base surface of the n-conductive semiconductor layer after applying the n-contacting layer and the metallization layer, and before partially removing the metallization layer.

11. An optoelectronic semiconductor component comprising:
a semiconductor layer sequence having a main extension plane, the semiconductor layer sequence comprising:
an n-conductive semiconductor layer formed in one piece;
an active zone and a p-conductive semiconductor layer divided into a plurality of regions which are laterally spaced apart from one another, wherein each region forms, together with the n-conductive semiconductor layer, precisely one image point;
an n-contacting layer configured to be electrically conductive, wherein a base surface of the n-contacting layer adjoins a cover surface of the n-conductive semiconductor layer;
a p-contacting layer configured to be electrically conductive, wherein a base surface of the p-contacting layer adjoins a cover surface of the p-conductive semiconductor layer; and
a third insulation layer configured to be electrically insulating and extending substantially transversely to the main extension plane of the semiconductor layer sequence,
wherein the third insulation layer is arranged between the p-conductive semiconductor layer and the n-contacting layer and directly adjoins all the lateral surfaces of the n-contacting layer and all the lateral surfaces of the p-conductive semiconductor layer,
wherein the n-contacting layer is continuous and surrounds the image points in a frame-like manner, and
wherein the cover surface of the n-conductive semiconductor layer is, in regions of the image points, at a larger distance to a base surface of the n-conductive semiconductor layer than in the region of the n-contacting layer.

12. The optoelectronic semiconductor component according to claim 11, wherein the image points are surrounded by the third insulation layer at all the lateral side faces.

13. The optoelectronic semiconductor component according to claim 11, further comprising a second insulation layer extending substantially transversely to the main extension plane of the semiconductor layer sequence and being arranged between the third insulation layer and the p-contacting layer.

14. The optoelectronic semiconductor component according to claim 11, further comprising a metallization layer arranged in a perpendicular direction to the main extension plane spaced apart from the n-contacting layer and from the p-contacting layer on cover surfaces of the second and third insulation layers facing away from the n-conductive semiconductor layer, wherein the metallization layer is reflective.

15. The optoelectronic semiconductor component according to claim 11, further comprising a fourth insulation layer completely surrounding the image points at side faces and directly adjoining the n-contacting layer, the metallization layer and the third insulation layer.

16. The optoelectronic semiconductor component according to claim 11, wherein a first insulation layer is arranged on a cover surface of the p-contacting layer directly adjoining a second insulation layer and wherein the first insulation layer covers a maximum of 10% of the cover surface of the p-contacting layer.

17. The optoelectronic semiconductor component according to claim 11, wherein a second insulation layer and the third insulation layer have traces of a material removal at their corners and edges facing away from the n-conductive semiconductor layer and the p-contacting layer.

18. The optoelectronic semiconductor component according to claim 11, wherein the image points have the same geometric dimensions within a scope of production tolerances.

19. The optoelectronic semiconductor component according to claim 11, wherein a geometric dimension of the n-contacting layer along an imaginary connection line between center points of two adjacent image points is at the most 5 µm.

20. The optoelectronic semiconductor component according to claim 11, wherein a lateral distance between two adjacent image points along an imaginary connection line between center points of the two adjacent image points is at the most 12 µm.

* * * * *